(12) United States Patent
Iwasaki et al.

(10) Patent No.: US 10,141,304 B2
(45) Date of Patent: Nov. 27, 2018

(54) SEMICONDUCTOR DEVICE

(71) Applicants: Shinya Iwasaki, Toyota (JP); Satoru Kameyama, Toyota (JP)

(72) Inventors: Shinya Iwasaki, Toyota (JP); Satoru Kameyama, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 15/029,583

(22) PCT Filed: Jul. 17, 2014

(86) PCT No.: PCT/JP2014/069060
§ 371 (c)(1),
(2) Date: Jul. 20, 2016

(87) PCT Pub. No.: WO2015/093086
PCT Pub. Date: Jun. 25, 2015

(65) Prior Publication Data
US 2016/0329323 A1 Nov. 10, 2016

(30) Foreign Application Priority Data
Dec. 17, 2013 (JP) .................................. 2013-260292

(51) Int. Cl.
*H01L 29/66* (2006.01)
*H01L 27/07* (2006.01)
(Continued)

(52) U.S. Cl.
CPC ...... *H01L 27/0727* (2013.01); *H01L 21/3223* (2013.01); *H01L 29/0804* (2013.01);
(Continued)

(58) Field of Classification Search
CPC ............ H01L 27/0629; H01L 27/0727; H01L 29/0804; H01L 29/0821; H01L 29/1095;
(Continued)

(56) References Cited

U.S. PATENT DOCUMENTS 5,808,352 A * 9/1998 Sakamoto ............... H01L 21/26
257/156
7,616,859 B2 * 11/2009 Tokura ................ H01L 27/0664
257/107
(Continued)

FOREIGN PATENT DOCUMENTS

CN 101764139 A 6/2010
CN 101794778 A 8/2010
(Continued)

*Primary Examiner* — Jay C Kim
(74) *Attorney, Agent, or Firm* — Oliff PLC

(57) ABSTRACT

A small semiconductor device having a diode forward voltage less likely to change due to a gate potential is provided. An anode and an upper IGBT structure (emitter and body) are provided in a range in the substrate exposed at the upper surface. A trench, a gate insulating film, and a gate electrode extend along a border of the anode and the upper IGBT structure. Cathode and collector are provided in a range in the substrate exposed at the lower surface. A drift is provided between an upper structure and a lower structure. A crystal defect region extends across the drift above the cathode and the drift above the collector. When a thickness of the substrate is defined as x [μm] and a width of a portion of the crystal defect region that protrudes above the cathode is defined as y [μm], $y \geq 0.007x^2 - 1.09x + 126$ is satisfied.

1 Claim, 4 Drawing Sheets

(51) Int. Cl.
*H01L 29/32* (2006.01)
*H01L 29/739* (2006.01)
*H01L 21/322* (2006.01)
*H01L 29/08* (2006.01)
*H01L 29/10* (2006.01)
*H01L 29/423* (2006.01)

(52) U.S. Cl.
CPC ...... *H01L 29/0821* (2013.01); *H01L 29/1095* (2013.01); *H01L 29/32* (2013.01); *H01L 29/4236* (2013.01); *H01L 29/7397* (2013.01)

(58) Field of Classification Search
CPC .. H01L 29/32; H01L 29/4236; H01L 29/7397
USPC ........................................................ 257/140
See application file for complete search history.

(56) References Cited

U.S. PATENT DOCUMENTS

| | | | | |
|---|---|---|---|---|
| 8,242,536 B2* | 8/2012 | Tanabe | ............... | H01L 29/0615 257/140 |
| 8,299,496 B2* | 10/2012 | Nagaoka | ............... | H01L 21/761 257/133 |
| 8,330,185 B2* | 12/2012 | Soeno | ............... | H01L 27/0664 257/133 |
| 8,334,193 B2* | 12/2012 | Iwasaki | ............... | H01L 21/263 257/E21.002 |
| 8,344,415 B2* | 1/2013 | Ruething | ............ | H01L 29/0696 257/119 |
| 8,748,236 B2* | 6/2014 | Tanida | ............... | H01L 21/268 257/656 |
| 8,841,699 B2* | 9/2014 | Tsuzuki | ............... | H01L 21/263 257/138 |
| 8,952,449 B2* | 2/2015 | Koyama | ............... | H01L 21/263 257/330 |
| 9,129,851 B2* | 9/2015 | Kouno | ............... | H01L 21/263 |
| 9,356,115 B2* | 5/2016 | Mizushima | ....... | H01L 29/66325 |
| 9,620,631 B2* | 4/2017 | Matsudai | ............. | H01L 29/7397 |
| 2005/0258493 A1* | 11/2005 | Aono | ................ | H01L 21/263 257/370 |
| 2009/0032851 A1* | 2/2009 | Pfirsch | ................ | H01L 21/221 257/288 |
| 2009/0278166 A1* | 11/2009 | Soeno | ................ | H01L 27/0664 257/133 |
| 2010/0009551 A1* | 1/2010 | Inoue | ................ | H01L 21/263 438/798 |
| 2010/0156506 A1* | 6/2010 | Tsuzuki | ............ | H01L 27/0664 327/478 |
| 2010/0187567 A1* | 7/2010 | Tanabe | ............. | H01L 29/0615 257/140 |
| 2012/0007141 A1* | 1/2012 | Soeno | ................ | H01L 27/0664 257/140 |
| 2012/0043581 A1 | 2/2012 | Koyama et al. | | |
| 2012/0043582 A1* | 2/2012 | Koyama | ............. | H01L 21/263 257/140 |
| 2012/0132954 A1 | 5/2012 | Kouno et al. | | |
| 2012/0132955 A1* | 5/2012 | Saito | ................ | H01L 27/0664 257/140 |
| 2013/0001639 A1* | 1/2013 | Iwasaki | ............. | H01L 21/761 257/140 |
| 2013/0075783 A1* | 3/2013 | Yamazaki | ............ | H01L 21/263 257/139 |
| 2013/0075784 A1* | 3/2013 | Ikeda | ................ | H01L 27/0727 257/140 |
| 2013/0181254 A1 | 7/2013 | Iwasaki | | |
| 2015/0206758 A1* | 7/2015 | Kato | ................ | H01L 21/265 438/459 |

FOREIGN PATENT DOCUMENTS

| | | |
|---|---|---|
| CN | 102376709 A | 3/2012 |
| CN | 102473705 A | 5/2012 |
| DE | 112010005443 T5 | 1/2013 |
| JP | H11-97715 A | 4/1999 |
| JP | 2010-147381 A | 7/2010 |
| JP | 2010-171385 A | 8/2010 |
| JP | 2010-199559 A | 9/2010 |
| JP | 2011-210800 A | 10/2011 |
| JP | 2011-216825 A | 10/2011 |
| JP | 2012-043890 A | 3/2012 |
| JP | 2012-129504 A | 7/2012 |
| JP | 2013-149909 A | 8/2013 |

\* cited by examiner

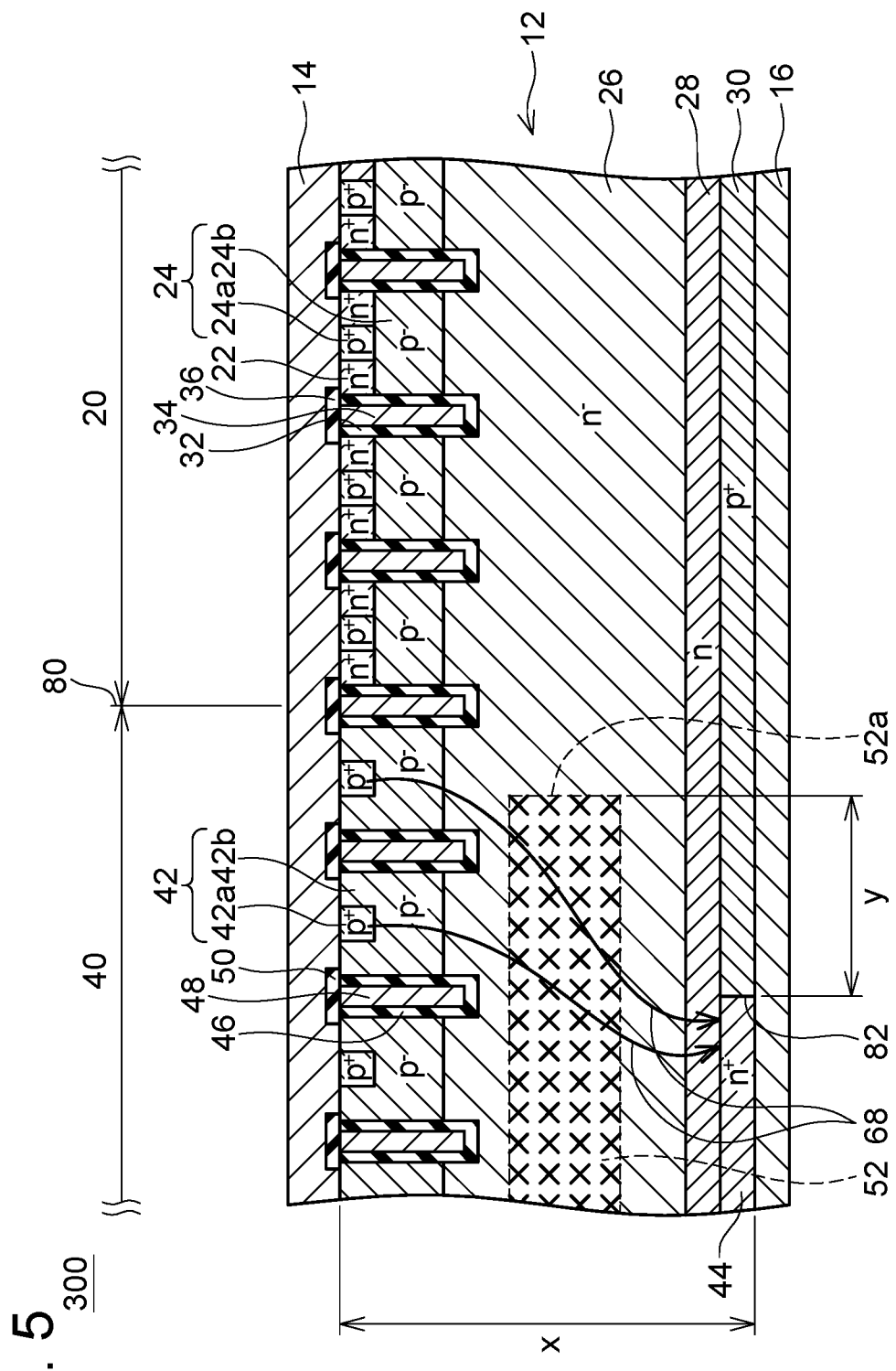

SEMICONDUCTOR DEVICE

CROSS REFERENCE TO RELATED APPLICATION

This application claims priority to Japanese Patent Application No. 2013-260292 filed on Dec. 17, 2013, the entire contents of which are hereby incorporated by reference into the present application.

TECHNICAL FIELD

The technique disclosed in the present teachings relates to a semiconductor device.

BACKGROUND ART

Japanese Patent Application Publication No. 2011-216825 (hereinbelow referred to as Patent Reference 1) discloses a semiconductor device including a diode region and an IGBT region. A lifetime control region is provided in a drift region of the semiconductor device. The lifetime control region is a region with a higher crystal defect density than its surroundings, and enhances recombination of carriers in the drift region.

SUMMARY OF INVENTION

Technical Problem

In the semiconductor device of Patent Reference 1, an anode region and a body region are separated by providing a low concentration n-type region or a deep p-type region therebetween. In this structure, the two regions cannot be suitably separated unless a wide-enough space is secured between the anode region and the body region, and there is a problem that a size of the semiconductor device becomes large.

Solution to Technical Problem

A semiconductor device disclosed herein comprises a semiconductor substrate, an upper electrode provided on an upper surface of the semiconductor substrate, and a lower electrode provided on a lower surface of the semiconductor substrate. An anode region and an upper IGBT structure are provided in a range in the semiconductor substrate that is exposed at the upper surface. The anode region is a p-type region connected to the upper electrode. The upper IGBT structure includes an n-type emitter region and a p-type body region. The emitter region is connected to the upper electrode. The body region is in contact with the emitter region and connected to the upper electrode. A trench extending along a border between the anode region and the upper IGBT structure is provided in the upper surface, and a gate insulating film and a gate electrode are provided in the trench. A cathode region and a collector region are provided in a range in the semiconductor substrate that is exposed at the lower surface. The cathode region is an n-type region connected to the lower electrode and provided in at least a part of a region below the anode region. The collector region is a p-type region connected to the lower electrode, provided in at least a part of a region below the upper IGBT structure, and being in contact with the cathode region. An n-type drift region is provided between an upper structure including the anode region and the upper IGBT structure and a lower structure including the cathode region and the collector region. A crystal defect region is provided across a portion of the drift region that is above the cathode region and a portion of the drift region that is above the collector region so that the crystal defect region is provided in a part of the portion of the drift region that is above the collector region. The crystal defect region having a density of crystal defects higher than a density of crystal defects in a surrounding region of the crystal defect region. When a thickness of the semiconductor substrate is defined as x μm and a width of a portion of the crystal defect region that protrudes from the portion of the drift region that is above the cathode region to the portion of the drift region that is above the collector region is defined as y μm, a relationship of $y \geq 0.007x^2 - 1.09x + 126$ is satisfied.

In this semiconductor device, the anode region and the upper IGBT structure are separated by the trench gate structure that comprises the gate electrode and the gate insulating film. Due to this, a width of a separating portion can be made smaller than in the configuration of Patent Reference 1. Further, by employing the separating structure using the trench gate structure, there may be a case where a property of diode changes due to a gate potential, since the anode region and the upper IGBT structure become closer. This will be described hereinbelow.

A pn junction is formed by the anode region and the drift region at a position adjacent to the trench gate structure, and a pn junction is also formed by the body region and the drift region as well. Hereinbelow, these pn junctions will be termed pn junctions in the vicinity of interface. In a state where the gate potential is low and channel is not formed in the body region, the pn junctions in the vicinity of interface turn on together with the primary diode when the upper electrode comes to be of a positive potential. Due to this, a forward voltage of the diode becomes low. Contrary to this, in a state where the gate potential is high and the channel is formed in the body region, the potential of the drift region becomes closer to the potential of the upper electrode in the pn junctions in the vicinity of interface. Due to this, the pn junctions in the vicinity of interface do not turn on, and the forward voltage of the diode becomes high. Accordingly, the forward voltage of the diode changes according to the gate potential.

However in the semiconductor device as described above and disclosed herein, this problem is suppressed from occurring. That is, in the semiconductor device disclosed herein, the crystal defect region with the higher crystal defect density than its periphery extends across the inside of the portion of the drift region above the cathode region and the inside of the portion of the drift region above the collector region. That is, the crystal defect region is provided in a current passage that is used upon when the pn junctions in the vicinity of interface are turned on. The crystal defect region enhances recombination of carriers. Due to this, current is less likely to flow in the pn junctions in the vicinity of interface. Accordingly, in this semiconductor device, the current is less likely to flow in the pn junctions in the vicinity of interface, so the forward voltage of the diode is less likely to be influenced by the turn-on and off of the pn junctions in the vicinity of interface. Thus, in this semiconductor device, the forward voltage of the diode is stabilized. Further, in this semiconductor device, the thickness (x μm) of the semiconductor substrate and the width (y μm) of the portion of the crystal defect region protruding into the drift region above the collector region satisfy the relationship of $y \geq 0.007x^2 - 1.09x + 126$. According to this configuration, same effect as in a case of providing the crystal defect region over an entirety of the portion of the drift region in its lateral direction above the collector region (effect of allowing less fluctuation in the forward voltage of the diode) can be achieved. Further, since the crystal defect region is provided only in a part of the drift region above the collector region, a rise on an on-voltage of the IGBT by the crystal defect does not occur so much. Due to this, the rise in the on-voltage of the IGBT can be suppressed and at the same time the forward voltage of the diode can be stabilized.

The crystal defect region may be provided in a portion of the drift region that is below the anode region, over an entirety of the portion in a lateral direction. Notably, "an entirety of the portion of the drift region below the anode region, in the lateral direction" means an entirety in a lateral direction of the semiconductor substrate (along a direction parallel to the upper surface of the semiconductor substrate). Thus, the portion where the crystal defect region is provided may be limited to local areas in a thickness direction of the semiconductor substrate.

The anode region may protrude toward the upper IGBT structure than the cathode region does. Further, the crystal defect region may extend across the portion of the drift region that is above the cathode region and a portion of the drift region that is below the upper IGBT structure.

BRIEF DESCRIPTION OF DRAWINGS

FIG. 5 is a vertical cross sectional view of a semiconductor device 300 of a third embodiment.

DETAILED DESCRIPTION

First Embodiment

Figure 1:
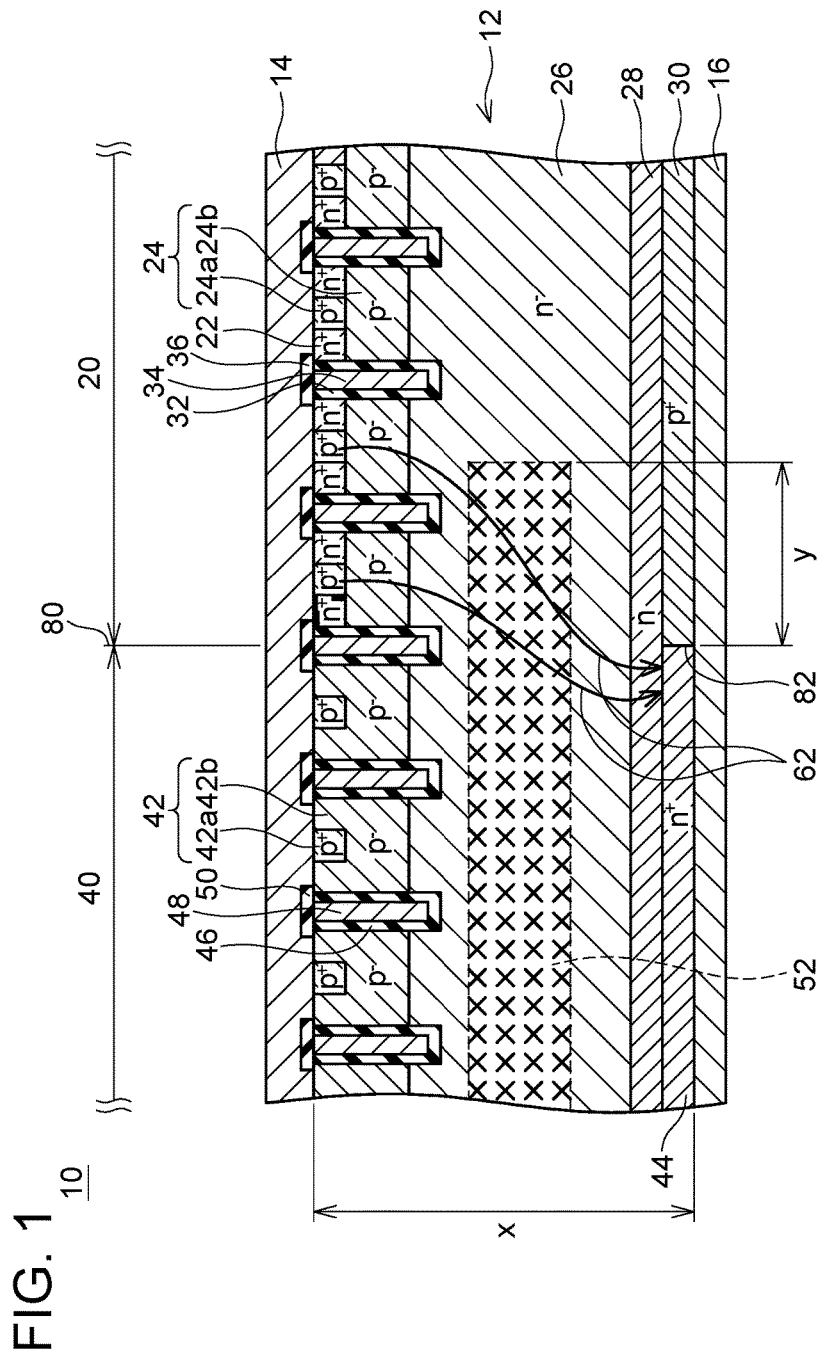
FIG. 1 is a vertical cross sectional view of a semiconductor device 10 of a first embodiment.

A semiconductor device 10 of an embodiment shown in FIG. 1 comprises a semiconductor substrate 12, an upper electrode 14, and a lower electrode 16. The semiconductor substrate 12 is a substrate made of silicon. The upper electrode 14 is provided on an upper surface of the semiconductor substrate 12. The lower electrode 16 is provided on a lower surface of the semiconductor substrate 12.

The semiconductor substrate 12 comprises an IGBT region 20 where a vertical type IGBT is provided, and a diode region 40 where a vertical type diode is provided.

Emitter regions 22, a body region 24, a drift region 26, a buffer region 28, and a collector region 30 are provided in the semiconductor substrate 12 within the IGBT region 20.

The emitter regions 22 are n-type regions, and are provided in ranges exposed at the upper surface of the semiconductor substrate 12. The emitter regions 22 are in ohmic connection with the upper electrode 14.

The body region 24 is a p-type region, and is provided in a range exposed at the upper surface of the semiconductor substrate 12. The body region 24 extend from sides of the emitter regions 22 to underneath the emitter regions 22. The body region 24 comprises body contact regions 24a, and a low concentration body region 24b. Each body contact region 24a has a high p-type impurity concentration. The body contact region 24a is provided in a range exposed at the upper surface of the semiconductor substrate 12, and is in ohmic connection with the upper electrode 14. The low concentration body region 24b has a p-type impurity concentration that is lower than the body contact regions 24a. The low concentration body region 24b is provided under the emitter regions 22 and the body contact regions 24a.

The drift region 26 is an n-type region, and is provided under the body region 24. The drift region 26 is separated from the emitter regions 22 by the body region 24. An n-type impurity concentration of the drift region 26 is low. The n-type impurity concentration of the drift region 26 is preferably less than $1 \times 10^{14}$ atoms/cm$^3$.

The buffer region 28 is an n-type region, and is provided under the drift region 26. An n-type impurity concentration of the buffer region 28 is higher than the drift region 26.

The collector region 30 is a p-type region, and is provided under the buffer region 28. The collector region 30 is provided in a range that is exposed at the lower surface of the semiconductor substrate 12. The collector region 30 makes ohmic connection to the lower electrode 16. The collector region 30 is separated from the body region 24 by the drift region 26 and the buffer region 28.

A plurality of trenches is provided in the upper surface of the semiconductor substrate 12 in the IGBT region 20. Each trench is provided at a position adjacent to a corresponding emitter region 22. Each trench extends to a depth reaching the drift region 26.

An inner surface of each trench in the IGBT region 20 is covered by a gate insulating film 32. Further, a gate electrode 34 is provided inside each trench. Each gate electrode 34 is insulated from the semiconductor substrate 12 by the gate insulating film 32. Each gate electrode 34 faces the corresponding emitter region 22, the low concentration body region 24b, and the drift region 26 via the gate insulating film 32. An insulating film 36 is provided above each gate electrode 34. Each gate electrode 34 is insulated from the upper electrode 14 by the insulating film 36.

Notably, one of the aforementioned trenches extends along an interface 80 between the IGBT region 20 and the diode region 40. That is, a trench gate structure including the gate electrode 34 and the gate insulating film 32 thereof is provided along the interface 80. The IGBT region 20 (that is, the emitter regions 22 and the body region 24) are separated from the diode region 40 (that is, an anode region 42) by this trench gate structure.

The anode region 42, the drift region 26, the buffer region 28, and a cathode region 44 are provided in the semiconductor substrate 12 within the diode region 40.

The anode region 42 is provided in a range that is exposed at the upper surface of the semiconductor substrate 12. The anode region 42 comprises anode contact regions 42a and a low concentration anode region 42b. Each anode contact region 42a has a high p-type impurity concentration. The anode contact region 42a is provided in a range that is exposed at the upper surface of the semiconductor substrate 12, and makes ohmic connection to the upper electrode 14. The low concentration anode region 42b has a p-type impurity concentration lower than the anode contact regions 42a. The low concentration anode region 42b is provided on sides of and below the anode contact regions 42a. Notably, the regions 42a, 42b may be common regions with substantially the same p-type impurity concentration. Further, the region 42a and the region 24a may be regions with substantially the same concentration, which are formed by one p-type impurity injection process.

The aforementioned drift region 26 is provided below the anode region 42. That is, the drift region 26 extends continuously from the IGBT region 20 to the diode region 40.

The aforementioned buffer region 28 is provided below the drift region 26 in the diode region 40. That is, the buffer region 28 extends continuously from the IGBT region 20 to the diode region 40.

The cathode region 44 is an n-type region, and is provided below the buffer region 28 in the diode region 40. The cathode region 44 is provided in a range exposed to the lower surface of the semiconductor substrate 12. The cathode region 44 has a higher n-type impurity concentration than the buffer region 28. The n-type impurity concentration of the cathode region 44 is preferably equal to or greater than $1\times10^{14}$ atoms/cm$^3$. The cathode region 44 makes ohmic connection with the lower electrode 16.

A plurality of trenches is provided in the upper surface of the semiconductor substrate 12 in the IGBT region 20. Each trench extends to the depth reaching the drift region 26.

An inner surface of each trench in the diode region 40 is covered by an insulating film 46. Further, a control electrode 48 is provided inside each trench. Each control electrode 48 is insulated from the semiconductor substrate 12 by the insulating film 46. Each control electrode 48 faces the anode region 42 and the drift region 26 via the insulating film 46. An insulating film 50 is provided above each control electrode 48. Each control electrode 48 is insulated from the upper electrode 14 by the insulating film 50.

A crystal defect region 52 is provided in the drift region 26. The crystal defect region 52 has a higher crystal defect density compared to the drift region 26 on an outer side thereof. The crystal defects in the crystal defect region 52 are generated by injecting charged particles such as helium ions to the semiconductor substrate 12. The crystal defects formed as above function as recombination centers of the carriers. Due to this, in the crystal defect region 52, carrier lifetime is shorter compared to the drift region 26 on the outer side thereof. The crystal defect region 52 is provided mainly in a range on an upper surface side within the drift region 26. Notably, in another embodiment, a crystal defect region may be provided at another depth within the drift region 26. Further, the crystal defect region may be provided over an entire region in the depth direction of the drift region 26. However, the crystal defect region is preferably provided at least in the range on the upper surface side of the drift region 26 (side closer to the anode region 42 and the body region 24). Further, in the lateral direction of the semiconductor substrate 12 (direction parallel to the upper surface of the semiconductor substrate 12), the crystal defect region 52 is provided over an entire region of the diode region 40. Further, a part of the crystal defect region 52 protrudes from the diode region 40 into the IGBT region 20. That is, the crystal defect region 52 extends across the diode region 40 and the IGBT region 20. In the IGBT region 20, the crystal defect region 52 is provided only in a range close to the diode region 40.

The semiconductor device 10 of FIG. 1 may be manufactured as follows. Firstly, an n-type semiconductor substrate having a substantially same n-type impurity concentration as the drift region 26 is prepared. At first, an upper surface-side structure of the semiconductor device 10 (emitter regions 22, body region 24, anode region 42, trench gate structures, upper electrode 14, etc.) is formed on the upper surface side of the semiconductor substrate. Next, the lower surface of the semiconductor substrate is polished to thin the semiconductor substrate. Then, n-type impurities and p-type impurities are injected to an entirety of the lower surface of the semiconductor substrate to form the buffer region 28 and the collector region 30. At this stage, the collector region 30 is formed also in the diode region 40 (however, in another embodiment, the collector region 30 may be formed only in the IGBT region 20). Then, the cathode region 44 is formed by injecting the n-type impurities to the lower surface of the semiconductor substrate in the diode region 40. Then, the crystal defect region 52 is formed by injecting helium ions to the lower surface of the semiconductor substrate while selecting the injection ranges by using a mask such as Al, Si, or resist (notably, in another embodiment, the helium ions may be injected from the upper surface side of the semiconductor substrate to form the crystal defect region 52). Then, the lower electrode 16 is formed on the lower surface of the semiconductor substrate. According to this, the semiconductor device 10 of FIG. 1 is manufactured. Notably, the formation of the crystal defect region 52 may be carried out before polishing the lower surface of the semiconductor substrate 12.

The IGBT in the IGBT region 20 operates similar to a general IGBT. Notably, in the semiconductor device 10 of the first embodiment, the crystal defect region 52 is provided in the drift region 26 in the IGBT region 20. Generally, when crystal defects are provided in the drift region of the IGBT, problems such as rise in the on-voltage of the IGBT, decrease in gate threshold, and increase in leak current occur. However, in the first embodiment, since the crystal defect region 52 in the IGBT region 20 is provided only locally in a vicinity of the interface 80 between the IGBT region 20 and the diode region 40, so the influence of the crystal defect region 52 on the IGBT properties is extremely limited. Thus, in the semiconductor device 10 of the first embodiment, the aforementioned problems can be suppressed.

When a voltage that positively charges the upper electrode 14 is applied between the upper electrode 14 and the lower electrode 16, the diode in the diode region 40 turns on. That is, current flows from the anode region 42 to the cathode region 44 through the drift region 26 and the buffer region 28. Further, a parasitic diode is generated in the IGBT region 20 by the pn junction between the body region 24 and the drift region 26. In the state where the diode in the diode region 40 is turned on, the parasitic diode also turns on. Thus, as shown by arrows 62 in FIG. 1, the current flows in the vicinity of the interface 80 between the IGBT region 20 and the diode region 40. However, in a case where the gate potential is equal to or greater than the gate threshold even in a state where the diode in the diode region 40 is turned on, the parasitic diode does not turn on. That is, if the gate potential is equal to or greater than the gate threshold, a channel is formed in the body region 24, and the potential of the drift region 26 in a vicinity of a lower end of the body region 24 comes to be substantially equal to the upper electrode 14. In this state, the applied voltage to the pn junction forming the parasitic diode becomes lower, as a result of which the parasitic diode does not turn on, and the current shown by the arrows 62 does not flow. As described above, whether or not the current shown by the arrows 62 flow changes according to the gate potential. Thus, the forward voltage of the diode changes according to the gate potential. However, in the semiconductor device 10 of the first embodiment, the current shown by the arrows 62 passes through the crystal defect region 52. Since the lifetime in the crystal defect region 52 is short, the current shown by the arrows 62 is small. As above, due to the current shown by the arrows 62 being small, the influence of the presence/absence of this current to the forward voltage of the diode is small. Thus, in the semiconductor device 10 of the first embodiment, the forward voltage of the diode is less likely to change by the gate potential.

Figure 2:
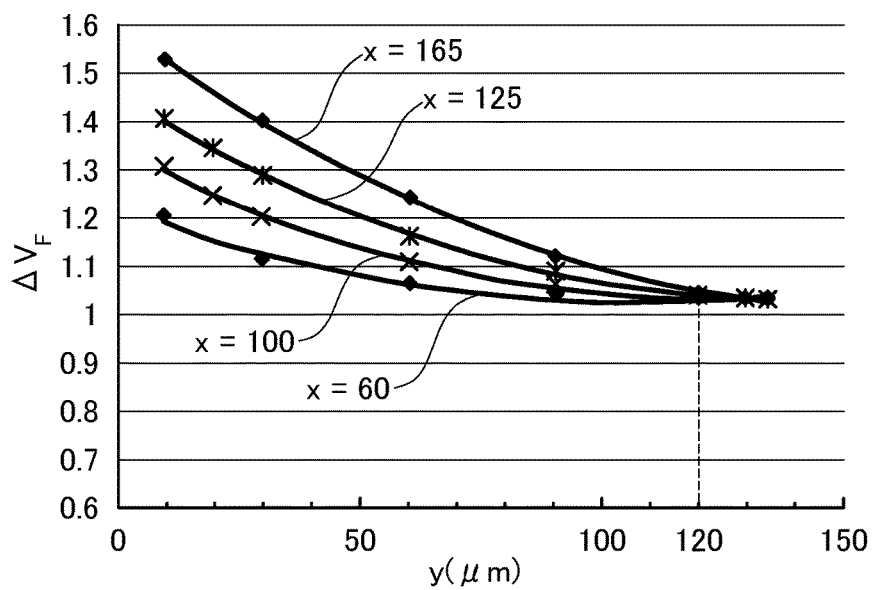
FIG. 2 is a graph indicating a relationship of a protruding amount y and a fluctuating amount ΔVF.

A graph shown in FIG. 2 indicates a relationship between a protruding amount y (μm) of the crystal defect region 52 and a fluctuating amount ΔVF of the forward voltage. The protruding amount y is a distance shown by a reference sign "y" in FIG. 1, and refers to a distance by which the crystal defect region 52 protrudes from an interface 82 between the cathode region 44 and the collector region 30 toward a collector region 30 side. The fluctuating amount ΔVF refers to a difference between a forward voltage VFp of the diode when the gate potential is equal to or greater than the gate threshold and a forward voltage VF0 of the diode when the gate potential is less than the gate threshold. Notably, the fluctuating amount ΔVF is scaled by setting the case where the crystal defect region 52 is provided over the entirety of the drift region 26 in the IGBT region 20 in the lateral direction (that is, the case where the protruding amount y is maximized) as 1. Thus, the fluctuating amount ΔVF being 1 means that the effect (effect of suppressing the current shown by the arrows 62) that is equal to the case of providing the crystal defect region 52 over the entirety of the drift region 26 in the IGBT region 20 in the lateral direction can be achieved. Further, the experiment of FIG. 2 was carried out using plural semiconductor substrates having different thicknesses x (μm). As shown in FIG. 2, the fluctuating amount ΔVF approaches closer to 1 with greater protruding amount y. This is because the current shown by the arrows 62 in FIG. 1 is suppressed greater with greater protruding amount y. Further, when the protruding amount y increases to a certain degree, the fluctuating amount ΔVF is maintained to a value close to 1 even if the protruding amount y is further increased. This means that the current shown by the arrows 62 in FIG. 1 flows in the vicinity of the interface 80 between the IGBT region 20 and the diode region 40 so the suppressing effect of the current shown by the arrows 62 will not change even if the protruding amount y is made unnecessarily large.

Figure 3:
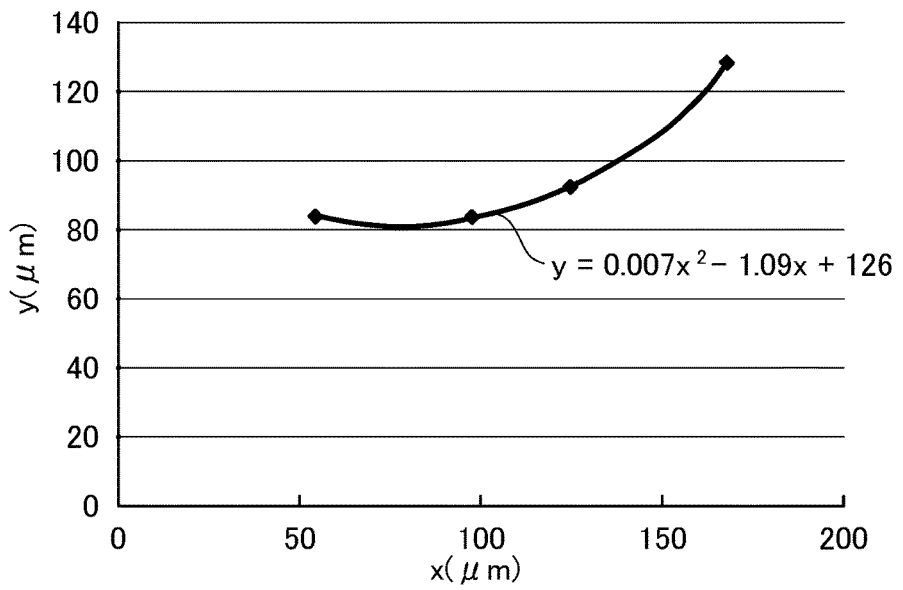
FIG. 3 is a graph indicating a relationship of a thickness x of a semiconductor substrate 12 and the protruding amount y when the fluctuating amount ΔVF is 1.

FIG. 3 indicates a relationship of the protruding amount y and the thickness x of the semiconductor substrate 12 when the fluctuating amount ΔVF is substantially 1, based on the graph of FIG. 2. In a case where the protruding amount y is larger than that in the graph shown in FIG. 3, the fluctuating amount ΔVF becomes substantially 1. From FIG. 3, it can be understood that the fluctuating amount ΔVF becomes substantially 1 in a case where the protruding amount y and the thickness x of the semiconductor substrate 12 satisfy a relationship of $y \geq 0.007x^2 - 1.09x + 126$. In the semiconductor device 10 of the first embodiment, the fluctuating amount ΔVF is minimized because the protruding amount y satisfies this relationship.

Accordingly, in the semiconductor device 10 of the first embodiment, the fluctuating amount ΔVF is minimized despite the fact that the crystal defect region 52 is provided only locally within the drift region 26 of the IGBT region 20, because the relationship of $y \geq 0.007x^2 - 1.09x + 126$ is satisfied. Further, since the crystal defect region 52 is provided only locally within the drift region 26 of the IGBT region 20, the rise in the on-voltage of the IGBT, the decrease in the gate threshold, and the increase in the leak current are suppressed. As above, according to the structure of the first embodiment, the fluctuating amount ΔVF can be minimized while maintaining the superior properties of the IGBT. Further, in the semiconductor device 10 of the first embodiment, the IGBT region 20 and the diode region 40 can be separated by the trench gate structure, as a result of which size reduction in the semiconductor device 10 is facilitated.

Second Embodiment

Figure 4:
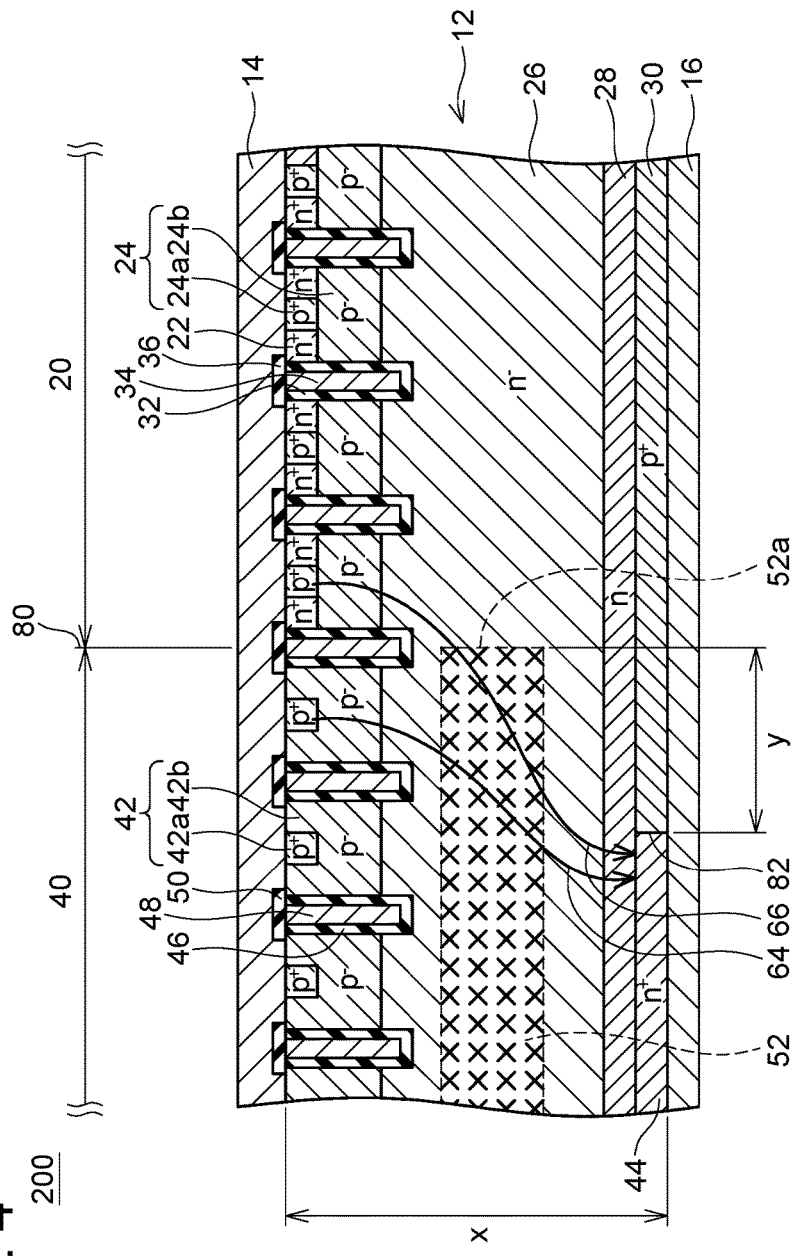
FIG. 4 is a vertical cross sectional view of a semiconductor device 200 of a second embodiment.

A semiconductor device 200 of a second embodiment shown in FIG. 4 comprises a similar upper surface-side structure as the semiconductor device 10 of the first embodiment. In the description of the second embodiment, the IGBT region 20 and the diode region 40 are distinguished by the structure on the upper surface side of the semiconductor substrate 12. That is, a region within the semiconductor substrate 12 where the emitter regions 22 and the body region 24 are provided will be called the IGBT region 20, and a region where the anode region 42 is provided will be called the diode region 40. In the semiconductor device 200 of the second embodiment, the interface 82 between the collector region 30 and the cathode region 44 is located on the diode region 40 side than the interface 80 between the IGBT region 20 and the diode region 40, in other words, the anode region 42 protrudes towards the IGBT region 20 side than the cathode region 44. Further, in the semiconductor device 200 of the second embodiment, a position of an end 52a of the crystal defect region 52 on the IGBT region 20 side substantially matches the position of the interface 80 between the IGBT region 20 and the diode region 40. That is, the crystal defect region 52 is not protruded to the IGBT region 20 side.

In the semiconductor device 200 of the second embodiment, when the diode turns on in a state where the gate potential is less than the gate threshold potential, the current flows in the vicinity of the interface 80 as shown by arrows 64, 66 in FIG. 4. That is, the cathode region 44 is not provided immediately below the anode region 42 adjacent to the IGBT region 20. Due to this, the current flows from the anode region 42 as shown by the arrow 64. Further, since the body region 24 in the vicinity of the interface 80 operates as the parasitic diode, the current flows as shown by the arrow 66. When the gate potential becomes equal to or greater than the gate threshold potential and the channel is formed in the body region 24, the potential of the drift region 26 in the vicinity of the lower end of the body region 24 rises. Due to this, the parasitic diode turns off, and the current shown by the arrow 66 no longer flows. Further, in this case, the potential of the drift region 26 in the vicinity of the lower end of the anode region 42 also rises in the vicinity of the interface 80 between the IGBT region 20 and the diode region 40. Due to this, the current shown by the arrow 64 also no longer flows. Thus, in the semiconductor device 200 of the second embodiment as well, the forward voltage of the diode changes according to the gate potential. Thus, the fluctuating amount ΔVF must be reduced.

As shown in FIG. 4, the current shown by the arrows 64, 66 passes through the crystal defect region 52. Thus, such a current can thereby be suppressed. In the semiconductor device 200 of the second embodiment, same relationships as those in FIGS. 2 and 3 can be achieved in investigating the relationships of the protruding amount y of the crystal defect region 52 from the interface 82 between the cathode region 44 and the collector region 30 toward the collector region 30 side (see FIG. 4) and the fluctuating amount ΔVF. Thus, in the semiconductor device 200 of the second embodiment as well, the fluctuating amount ΔVF can be minimized while maintaining the superior properties of the IGBT with the relationship of $y \geq 0.007x^2 - 1.09x + 126$ being satisfied.

Third Embodiment

A semiconductor device 300 of a third embodiment shown in FIG. 5 comprises a similar upper surface-side structure as the semiconductor device 200 of the second embodiment. Thus, in the description of the third embodiment, the IGBT region 20 and the diode region 40 are distinguished by the structure on the upper surface side of the semiconductor substrate 12 as in the second embodiment. In the semiconductor device 300 of the third embodiment, the interface 82 between the collector region 30 and the cathode region 44 is located further on the diode region 40 side than in the semiconductor device of the second embodiment. Further, in the semiconductor device 300 of the third embodiment, the position of the end 52a of the crystal defect region 52 on the IGBT region 20 side is located on the diode region 40 side than the interface 80 between the IGBT region 20 and the diode region 40.

In the semiconductor device 300 of the third embodiment, when the diode turns on in the state where the gate potential is less than the gate threshold potential, the current flows in the vicinity of the interface 80 as shown by arrows 68 in FIG. 5. When the gate potential becomes equal to or greater than the gate threshold potential and the channel is formed in the body region 24, the potential of the drift region 26 in the vicinity of the lower end of the body region 24 rises, and the potential of the drift region 26 in the vicinity of the anode region 42 also rises in the vicinity of the interface 80. Due to this, the current shown by the arrows 68 no longer flows. Thus, in the semiconductor device 300 of the third embodiment as well, the forward voltage of the diode changes according to the gate potential. Thus, the fluctuating amount ΔVF must be reduced.

As shown in FIG. 5, the current shown by the arrows 68 passes through the crystal defect region 52. Thus, such a current can thereby be suppressed. In the semiconductor device 300 of the third embodiment, same relationships as those in FIGS. 2 and 3 can be achieved in investigating the relationships of the protruding amount y of the crystal defect region 52 from the interface 82 between the cathode region 44 and the collector region 30 toward the collector region 30 side (see FIG. 5) and the fluctuating amount ΔVF. Thus, in the semiconductor device 300 of the third embodiment as well, the fluctuating amount ΔVF can be minimized while maintaining the superior properties of the IGBT with the relationship of y≥0.007x²−1.09x+126 being satisfied. Notably, as is apparent from FIG. 3, the protruding amount y may be set to be equal to or greater than 83 μm in the case where the thickness x is less than 80 μm.

Notably, so long as the relationship of y≥0.007x²−1.09x+ 126 is satisfied, the positional relationship between the structure on the upper side of the semiconductor device (position of the interface 80 between the IGBT region 20 and the diode region 40), the structure on the lower surface side of the semiconductor device (position of the interface 82 between the collector region 30 and the cathode region 44), and the crystal defect region 52 may be in any positional relationship. For example, the crystal defect region 52 in FIG. 4 or 5 may be protruding from the diode region 40 into the IGBT region 20.

In the case where y satisfies the aforementioned relationship, it is preferable that the thickness x of the semiconductor substrate 12 satisfies 165≥x≥60.

Further, the protruding amount y is especially preferable to be y≥120. As is apparent from FIG. 2, according to this configuration, the fluctuating amount ΔVF can be minimized so long as the thickness x of the semiconductor substrate 12 is in a range of 165≥x≥60.

Further, in the case of causing the crystal defect region 52 to protrude into the IGBT region 20 as shown in FIG. 1, for example, a width of the crystal defect region 52 protruding into the IGBT region 20 is preferably equal to or less than 90% of a width of the IGBT region 20. According to this configuration, the fluctuating amount ΔVF can be minimized while generating hardly any influence of the crystal defect region 52 on the properties of the IGBT.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGNS LIST

10: semiconductor device
12: semiconductor substrate
14: upper electrode
16: lower electrode
20: IGBT region
22: emitter region
24: body region
24a: body contact region
24b: low concentration body region
26: drift region
28: buffer region
30: collector region
32: gate insulating film
34: gate electrode
40: diode region
42: anode region
42a: anode contact region
42b: low concentration anode region
44: cathode region
46: insulating film
48: control electrode
52: crystal defect region

The invention claimed is:
1. A semiconductor device comprising:
a semiconductor substrate;
an upper electrode provided on an upper surface of the semiconductor substrate; and
a lower electrode provided on a lower surface of the semiconductor substrate;
wherein
an anode region and an upper Insulated Gate Bipolar Transistor (IGBT) structure are provided in a range in the semiconductor substrate that is exposed at the upper surface,
a trench is provided in the upper surface,
the anode region is separated from the upper IGBT structure by the trench, the anode region is in contact with the trench, and the upper IGBT structure is in contact with the trench,
the anode region is a p-type region connected to the upper electrode,
the upper IGBT structure includes an n-type emitter region and a p-type body region, the emitter region connected to the upper electrode, and the body region being in contact with the emitter region and connected to the upper electrode, a gate insulating film and a gate electrode are provided in the trench, a cathode region and a collector region are provided in a range in the semiconductor substrate that is exposed at the lower surface, the cathode region bordering the collector region at an interface;

the cathode region is an n-type region connected to the lower electrode and provided in at least a part of a region below the anode region, the collector region is a p-type region connected to the lower electrode, provided in at least a part of a region below the upper IGBT structure, and being in contact with the cathode region, an n-type drift region is provided between an upper structure including the anode region and the upper IGBT structure and a lower structure including the cathode region and the collector region, a crystal defect region is provided across a portion of the drift region that is above the cathode region and a portion of the drift region that is above the collector region so that the crystal defect region is provided in a part of the portion of the drift region that is above the collector region, the crystal defect region having a density of crystal defects higher than a density of crystal defects in a surrounding region of the crystal defect region, the semiconductor substrate has a dimension that satisfies a relationship of $y \geq 0.007x^2 - 1.09x + 126$ within a range of 165 µm $\geq$ x $\geq$ 60 µm, where x is a number in the unit of µm and represents a thickness of the semiconductor substrate and y is a number in the unit of µm and represents a width of a portion of the crystal defect region that protrudes along a direction parallel to the upper surface of the semiconductor substrate from the portion of the drift region that is above the cathode region to the portion of the drift region that is above the collector region, the trench and the interface are separate from each other when viewed in plan view, with the trench above the collector region and the interface below the anode region and without the interface directly below the trench, such that the anode region extends toward the upper IGBT structure more than the cathode region does, and the portion of the crystal defect region does not protrude beyond the trench to a portion of the drift region that is below the upper IGBT structure.

* * * * *